(12) United States Patent
Cheng et al.

(10) Patent No.: US 7,943,855 B2
(45) Date of Patent: May 17, 2011

(54) FLEXIBLE PRINTED CIRCUIT BOARD AND ELECTRONIC COMPONENT ASSEMBLY

(75) Inventors: Chi-Chen Cheng, Changhua County (TW); Chi-Chung Lo, Changhua County (TW)

(73) Assignee: AU Optronics Corp., Hsinchu (TW)

( * ) Notice: Subject to any disclaimer, the term of this patent is extended or adjusted under 35 U.S.C. 154(b) by 1067 days.

(21) Appl. No.: 11/425,442

(22) Filed: Jun. 21, 2006

(65) Prior Publication Data
US 2007/0193773 A1    Aug. 23, 2007

(30) Foreign Application Priority Data

Feb. 22, 2006  (TW) ................. 95105923 A

(51) Int. Cl.
*H05K 1/00* (2006.01)
(52) U.S. Cl. ............ 174/252; 174/254; 174/260
(58) Field of Classification Search .......... 174/252, 174/260, 254
See application file for complete search history.

(56) References Cited

U.S. PATENT DOCUMENTS

| | | | |
|---|---|---|---|
| 5,285,352 A * | 2/1994 | Pastore et al. | 361/707 |
| 5,467,253 A * | 11/1995 | Heckman et al. | 361/761 |
| 5,737,191 A * | 4/1998 | Horiuchi et al. | 361/764 |
| 6,156,980 A | 12/2000 | Peugh et al. | |
| 6,232,558 B1 * | 5/2001 | Tsukada et al. | 174/252 |
| 6,297,964 B1 * | 10/2001 | Hashimoto | 361/760 |
| 6,490,161 B1 * | 12/2002 | Johnson | 361/704 |
| 6,744,135 B2 * | 6/2004 | Hasebe et al. | 257/712 |
| 6,760,225 B1 | 7/2004 | Chen et al. | |
| 2002/0189853 A1 * | 12/2002 | Hsu | 174/252 |
| 2005/0157469 A1 | 7/2005 | Gorak | |

FOREIGN PATENT DOCUMENTS

| | | |
|---|---|---|
| TW | 419115 | 2/1988 |
| TW | I246337 | 8/1993 |
| TW | 430959 | 4/2001 |
| TW | 525834 | 3/2003 |
| TW | 562385 | 11/2003 |

OTHER PUBLICATIONS

English language translation of abstract of TWI246337.
English language translation of abstract of TW419115.
English language translation of abstract of TW430959.
English language translation of abstract of TW562385.
English language translation of abstract of TW525834.

* cited by examiner

*Primary Examiner* — Ishwarbhai B Patel
(74) *Attorney, Agent, or Firm* — Thomas | Kayden

(57) ABSTRACT

A flexible printed circuit (FPC) and electronic component assembly. The FPC comprises a first protective layer having a first opening, a main layer on the first protective layer, and a second protective layer having a second opening exposing the main layer. The heat produced from the electronic component can be transmitted to the main layer by a heat-conductive medium between the electronic component and the main layer, and can be diffused via the first opening.

14 Claims, 4 Drawing Sheets

FLEXIBLE PRINTED CIRCUIT BOARD AND ELECTRONIC COMPONENT ASSEMBLY

This application claims the benefit of Taiwan Application Serial No. 95105923, filed Feb. 22, 2006, the subject matter of which is incorporated herein by reference.

BACKGROUND OF THE INVENTION

1. Field of the Invention

The invention relates to a flexible printed circuit (FPC) and electronic component assembly. The heat produced from the electronic component can be diffused from an opening in the backside of the FPC.

2. Description of the Related Art

A flexible printed circuit (FPC) board can be bent for connecting to different rigid printed circuit boards, PCBs for example, and thus are widely used in various electronic products such as cellular phones, cameras, liquid crystal displays, etc. FIG. 1 shows an example of an electronic component bonded on an FPC. As shown in FIG. 1, The FPC comprises an electric-conductive main layer 120, a first protective layer 124, and a second protective layer 112.

Copper is the most popular material for use in the main layer 120 and is etched to form the circuit. Polyimide (PI) is widely used as the material of the first protective layer 124 and second protective layer 112. These two layers are adhered on the front and back surface of the main layer 120.

The leads 102 and 104 of the electronic component 100 are soldered on the main layer 120 via tin solder 106 and 108 to make electrical connections with the FPC. Besides soldering, the tape automated bonding (TAB) technique is another method for making an electrical connection.

In order to satisfy the heat dissipation demands of some electronic components, such as CPUs, LEDs, and the like, an opening 126 is provided in the second protective layer 112. Heat is transmitted through the heat-conductive medium 110 on the opening 126 to the main layer 120. The heat-conductive medium 110 may be a thin plate with high heat-conductivity, or heat-conductive paste with silicon or silver balls therein.

With the technology development of the electronic component 100 can bear higher operating power, but it also produces more heat. The PI material is not adequate for heat-conduction. As shown in FIG. 2, an aluminum plate is sometimes used as the material of the first protective layer 224 to gain a higher heat-dissipating efficiency, however, this method results in a higher cost and reduced FPC flexibility.

BRIEF SUMMARY OF THE INVENTION

To solve the problems described, the invention offers an assembly of an FPC and an electronic component. The FPC comprises a first protective layer having a first opening, a main layer on the first protective layer, and a second protective layer having a second opening on the main layer. The heat produced from an electronic component can be transmitted to the main layer by a heat-conductive medium between the electronic component and the main layer, and diffused via the first opening.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
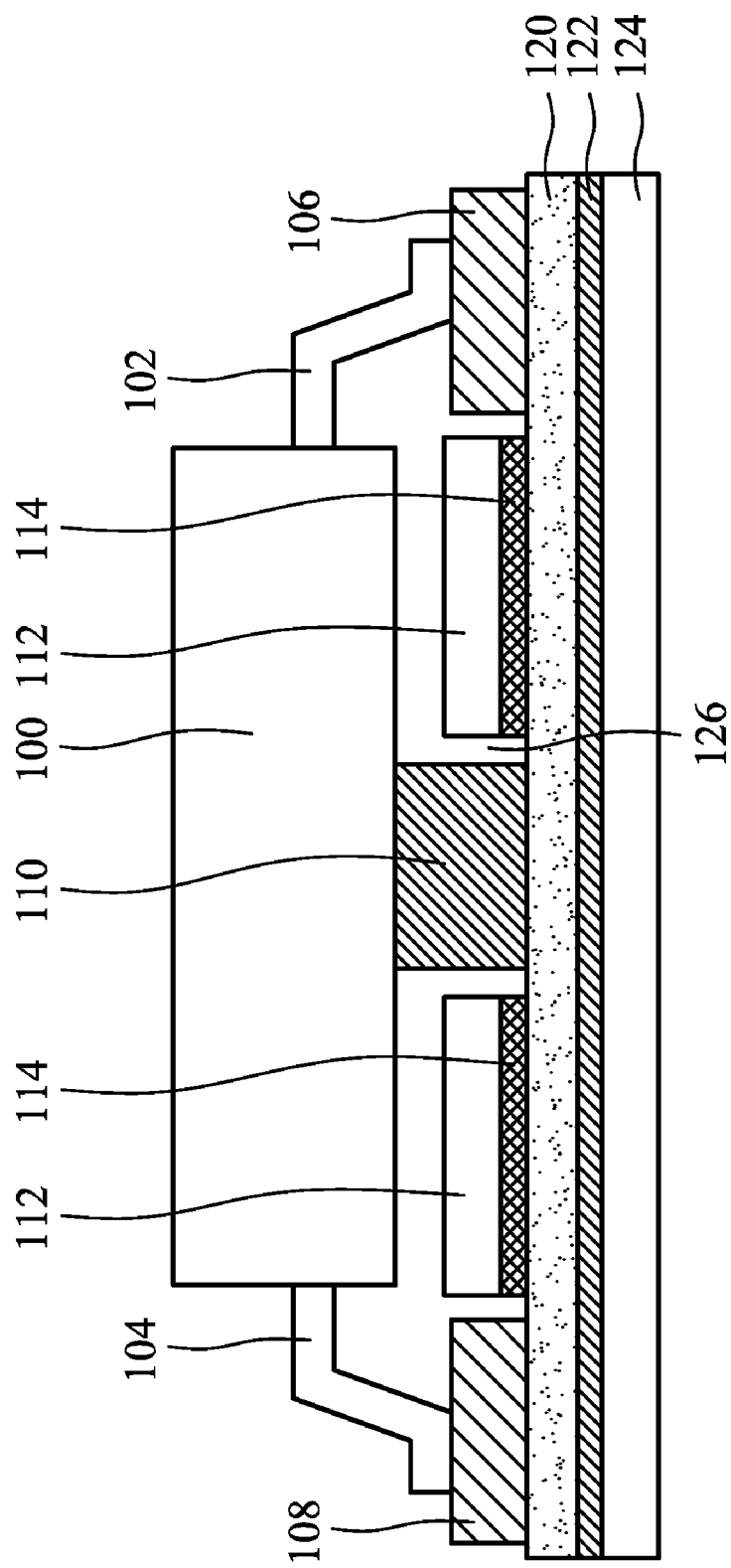
FIG. 1 is cross section of a conventional assembly of an FPC and an electronic component.
Figure 2:
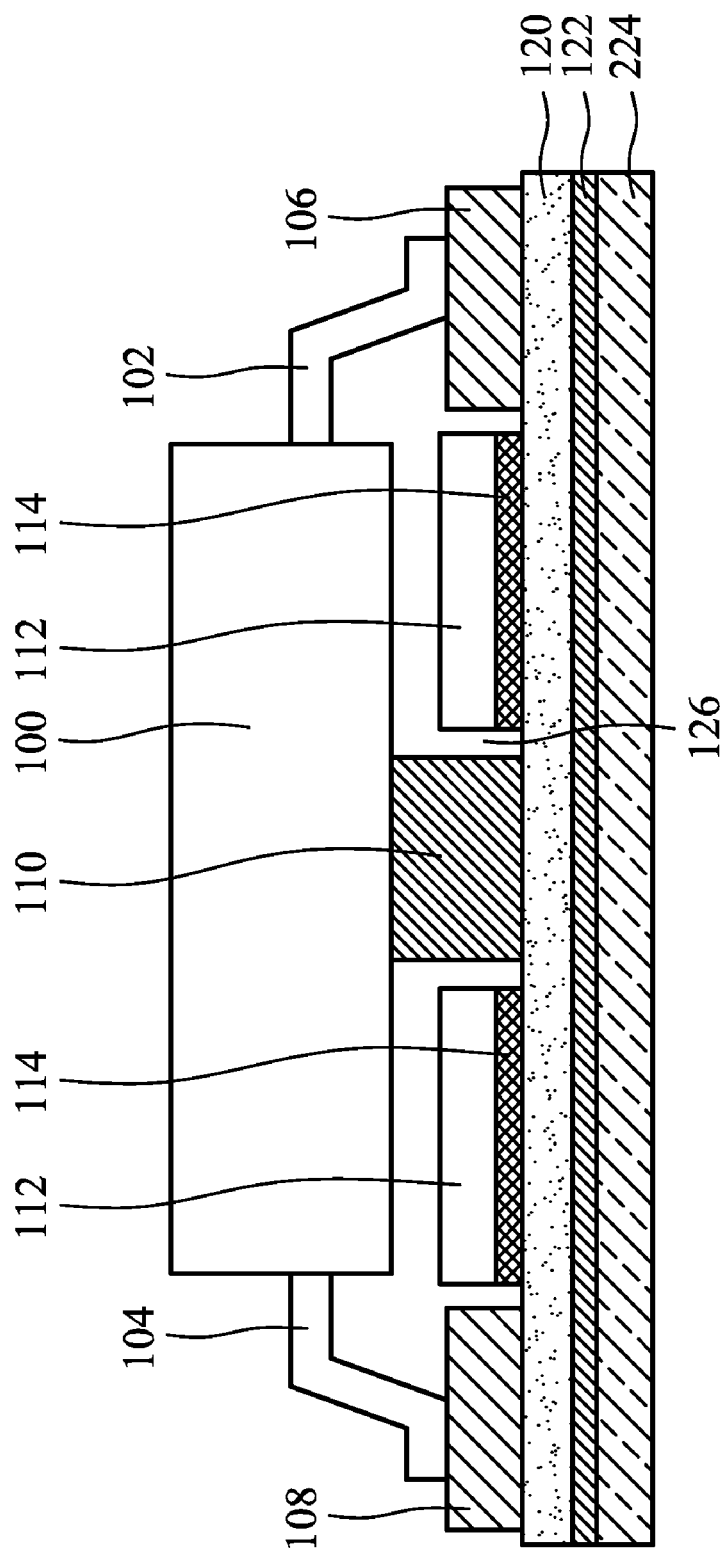
FIG. 2 depicts another conventional assembly of an FPC and an electronic component in which the first protective layer is an aluminum plate.
Figure 3:
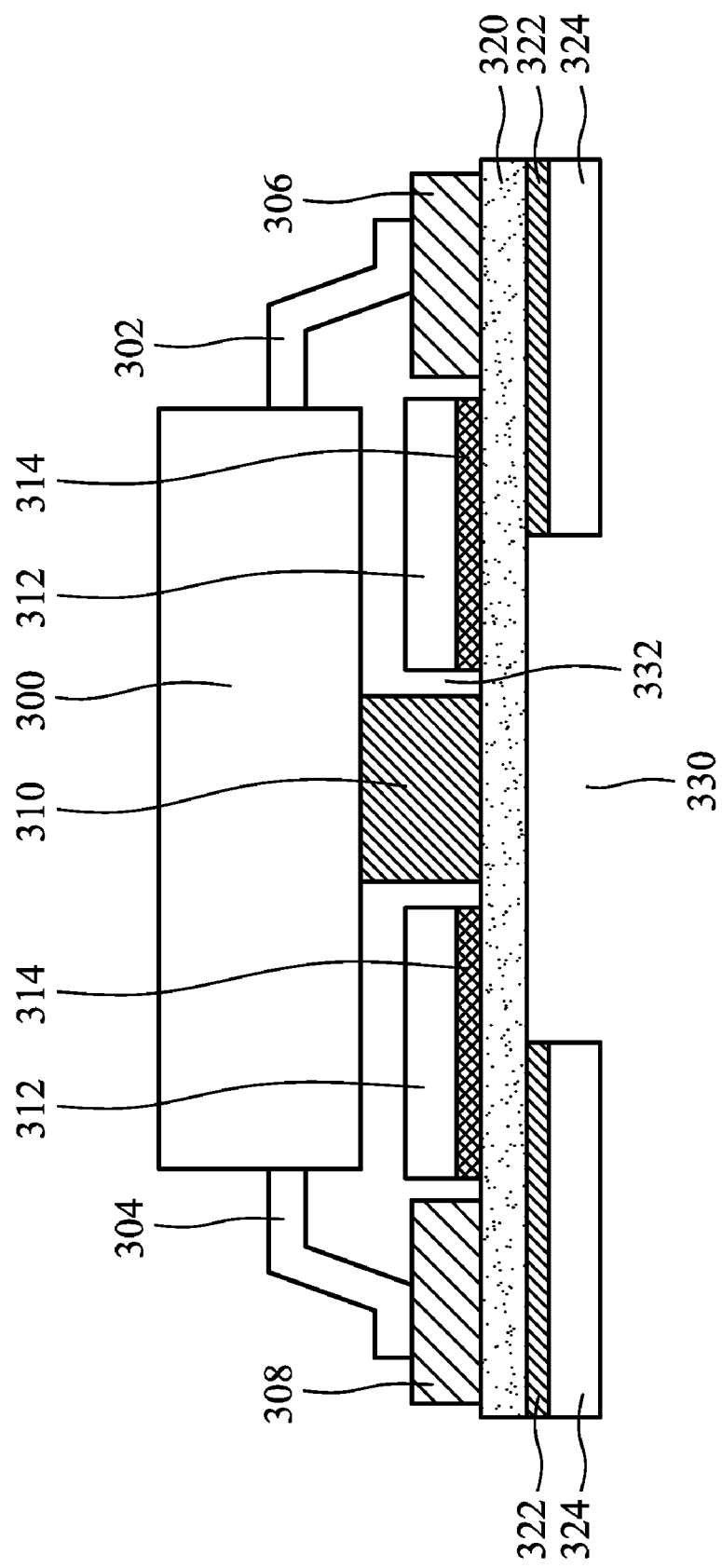
FIG. 3 is a schematic view showing the first embodiment of the invention.

FIG. 3 illustrates the first embodiment of the invention. The FPC comprises a main layer 320, a first protective layer 324, and a second protective layer 312. The first protective layer 324 and the second protective layer 312 can be adhered on the first and second sides of a main layer 320 via adhesive material 322 and 314.

The material of the main layer 320 is highly electric-conductive and highly heat-conductive copper, and etched to form the circuit. The material of the first and second protective layers is Polyimide (PI), for example.

The first protective layer 324 has a first opening 330 therein to reveal the first surface of main layer 320; the second protective layer 312 has a second opening 332 therein revealing the second surface of main layer 320. The superficial projection of the first opening 330 partially or fully overlaps the second opening 332, in other words, as shown in FIG. 3, the first opening 330 partially overlaps the second opening 332.

The leads 302 and 304 of an electronic component 300 are electrically connected to the FPC by soldering or TAB technique. Reference numerals 306 and 308 represent tin solder. A heat-conductive medium 310 is disposed between the electronic component 300 and the main layer 320. The heat-conductive medium 310 can be a thin plate with high heat conductivity, or heat conductive paste with tiny heat conductive silver or silicon balls.

The heat conductive medium 310, the main layer 320, and the first opening 330 form a shortest heat dissipation path, thus the heat produced from the electronic component 300 can be transmitted to the main layer 320 by the heat-conductive medium 310, and diffused via the first opening 330.

Further, a heat-dissipating member, such as heat conductive paste (not shown), can be disposed in the first opening 330 to increase heat-dissipating efficiency.

Figure 4:
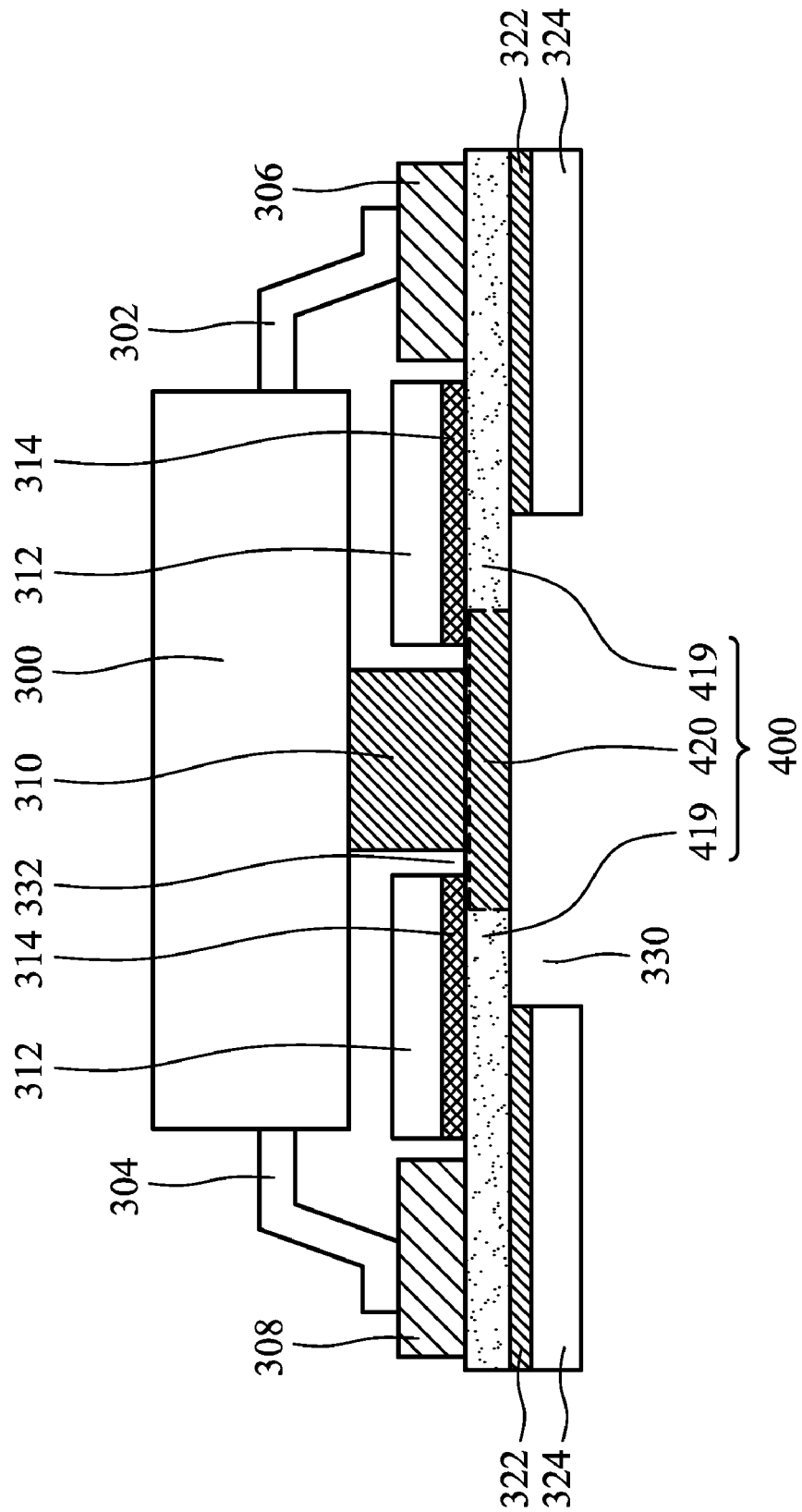
FIG. 4 is a schematic view showing the second embodiment of the invention.

FIG. 4 illustrates the second embodiment of the present invention. The FPC comprises a main layer 400, a first protective layer 324, and a second protective layer 312. The first protective layer 324 and the second protective layer 312 can be adhered on the first and second sides of the main layer 400 through adhesive material 322 and 314.

The main layer 400 in this embodiment can be divided into heat-conductive portion 420 and electric-conductive portion 419. The electric-conductive portion 419 can be made of a highly electric-conductive material (such as copper), and be etched to form the circuit; the heat conductive part 420 can be made of a highly heat-conductive material, such as low electric-conductive graphite or silicon, or highly electric-conductive copper or silver.

The first protective layer 324 has a first opening 330 therein exposing the first surface of the heat-conductive portion 420;

the second protective layer 312 has a second opening 332 therein exposing the second surface of heat-conductive portion 420.

A heat-conductive medium 310 is disposed between the electronic component 300 and the heat-conductive portion 420. The heat conductive medium 310, the heat-conductive portion 420, and the first opening 330 form a shortest heat dissipating path, therefore the heat produced from the electronic component 300 can be transmitted to the heat-conductive portion 420 through the heat-conductive medium 310, and be diffused via the first opening 330.

The described embodiments of the present invention are both effective for the heat dissipation of high-power electronic components (CPUs, LEDs, etc.) and satisfy the demands for low cost and the flexibility requirements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An assembly comprising:
   a flexible printed circuit board comprising:
   a first protective layer with a first opening therein;
   a main layer on the first protective layer, the main layer is exposed to ambient air through the first opening; and
   a second protective layer, formed on the main layer, with a second opening therein;
   an electronic component electrically connected to the main layer of the flexible printed circuit board, wherein the second protective layer is located between the electronic component and the main layer, and wherein the first and second openings are formed on opposite sides of the main layer, and the first opening partly overlaps the second opening; and
   a heat conductive medium between the electronic component and the main layer.

2. The assembly as claimed in claim 1, wherein the first protective layer is made of polyimide.

3. The assembly as claimed in claim 1, wherein the electronic component is a light emitting diode.

4. The assembly as claimed in claim 1, wherein the electronic component is a central process unit.

5. The assembly as claimed in claim 1, wherein the heat conductive medium is a heat-conductive plate or heat-conductive paste.

6. The assembly as claimed in claim 1, wherein the electronic component is electrically connected with the flexible printed circuit board by soldering or tape automated bonding.

7. The assembly as claimed in claim 1, further comprising a heat-dissipating member adjacent to the first opening.

8. The assembly as claimed in claim 7, wherein the heat-dissipating member is heat-conductive paste.

9. The assembly as claimed in claim 1, wherein the main layer has an electric-conductive portion electrically connected with the electronic component.

10. The assembly as claimed in claim 9, wherein the electric-conductive portion comprises copper.

11. The assembly as claimed in claim 9, wherein the main layer further has a heat conductive portion comprised of the same material as that of the electric-conductive portion.

12. The assembly as claimed in claim 9, wherein the main layer further has a heat conductive portion comprised of a material different from that of the electric-conductive portion.

13. The assembly as claimed in claim 9, wherein the heat-conductive portion has a first surface and a second surface opposite to the first surface, the first opening exposes the first surface of the heat-conductive portion, and the second opening exposes the second surface of the heat-conductive portion.

14. The assembly as claimed in claim 1, wherein the first opening is larger than the second opening.

* * * * *